US007867854B2

(12) United States Patent
Lin et al.

(10) Patent No.: US 7,867,854 B2
(45) Date of Patent: Jan. 11, 2011

(54) METHOD OF FABRICATING POWER SEMICONDUCTOR DEVICE

(75) Inventors: Wei-Chieh Lin, Hsinchu (TW); Hsin-Yu Hsu, Chiayi County (TW); Guo-Liang Yang, Hsinchu (TW); Jen-Hao Yeh, Kaohsiung County (TW)

(73) Assignee: Anpec Electronics Corporation, Hsinchu Science Park, Hsin-Chu (TW)

( * ) Notice: Subject to any disclaimer, the term of this patent is extended or adjusted under 35 U.S.C. 154(b) by 68 days.

(21) Appl. No.: 12/507,808

(22) Filed: Jul. 23, 2009

(65) Prior Publication Data

US 2010/0285646 A1    Nov. 11, 2010

(30) Foreign Application Priority Data

May 8, 2009    (TW) .............................. 98115269 A

(51) Int. Cl.
*H01L 21/336* (2006.01)
(52) U.S. Cl. ................... 438/270; 438/272; 438/589; 257/E21.428
(58) Field of Classification Search ................ 438/270, 438/271, 272, 589, 268, 274; 257/E21.428
See application file for complete search history.

(56) References Cited

U.S. PATENT DOCUMENTS

| 5,614,751 | A | 3/1997 | Yilmaz et al. |
| 5,763,915 | A | 6/1998 | Hshieh et al. |
| 6,054,752 | A | 4/2000 | Hara et al. |
| 6,946,348 | B2 | 9/2005 | Zeng |
| 6,987,305 | B2 * | 1/2006 | He et al. ..................... 257/417 |
| 7,049,194 | B2 | 5/2006 | Hshieh et al. |
| 7,087,958 | B2 * | 8/2006 | Chuang et al. .............. 257/335 |
| 7,612,407 | B2 * | 11/2009 | Hshieh ....................... 257/330 |
| 2008/0079081 | A1 * | 4/2008 | Hashimoto ................... 257/363 |
| 2009/0020810 | A1 * | 1/2009 | Marchant .................... 257/331 |

* cited by examiner

*Primary Examiner*—Michael Trinh
(74) *Attorney, Agent, or Firm*—Winston Hsu; Scott Margo

(57) ABSTRACT

Wider and narrower trenches are formed in a substrate. A first gate material layer is deposited but not fully fills the wider trench. The first gate material layer in the wider trench and above the substrate original surface is removed by isotropic or anisotropic etching back. A first dopant layer is formed in the surface layer of the substrate at the original surface and the sidewall and bottom of the wider trench by tilt ion implantation. A second gate material layer is deposited to fully fill the trenches. The gate material layer above the original surface is removed by anisotropic etching back. A second dopant layer is formed in the surface layer of the substrate at the original surface by ion implantation. The dopants are driven-in to form a base in the substrate and a bottom-lightly-doped layer surrounding the bottom of the wider trench and adjacent to the base.

13 Claims, 12 Drawing Sheets

METHOD OF FABRICATING POWER SEMICONDUCTOR DEVICE

BACKGROUND OF THE INVENTION

1. Field of the Invention

The present invention relates to a method of manufacturing a power device, and more particularly, to a method for manufacturing a power semiconductor device capable of improving uniform distribution of electric field.

2. Description of the Prior Art

Power devices are typical semiconductor devices in power management applications, such as a switching power supply, a power control IC of a computer system or peripherals, a power supply of a backlight, motor controller, etc. Power devices can include various kinds of transistors, such as an insulated gate bipolar transistor (IGBT), a metal-oxide-semiconductor field effect transistor (MOSFET) and a bipolar junction transistor (BJT).

Furthermore, developments of trench power MOSFETs become an important tendency, because trench power MOSFETs can provide a lower electric resistance in conduction and a smaller device dimension, and can effectively control voltages with the fewer power-consumption. As shown in FIG. 1, a trench power MOSFET 10 includes an $n^+$ type semiconductor wafer substrate 12. An n- type semiconductor layer 14 is formed on the semiconductor wafer substrate 12 by epitaxy. A first trench 16, a plurality of second trenches 18, a p type body 20, a plurality of $p^+$ type regions 21, and a plurality of $n^+$ type source regions 22 are formed in the semiconductor layer 14. A gate oxide layer 32 and a polysilicon material 34 are disposed within the first trench 16 and the second trenches 18. The polysilicon material 34 serves as a gate of the trench power MOSFET 10. The power device further includes an interlayer dielectric 24 covering the p type base 20, the gate, and the source regions 22. A gate metal layer 26 is disposed on the interlayer dielectric 24 and connects with the gate within the first trench 16 through a contact plug 28. A source metal layer 27 is disposed on the interlayer dielectric 24 and connects with the source regions 22 and the $p^+$ type regions 21 through a plurality of contact plugs 30. A drain metal layer 36 is disposed on the other side of the semiconductor wafer substrate 12.

The desire for ever more compact electronic devices has pushed for size reductions in integrated circuits. Therefore, higher integrations and higher densities are developed continuously. The layout design for the conventional trench power MOSFET 10 structure has been investigated to reduce the trench width and the trench pitch. However, the layout design already reaches the process limitation. For example, there is a process limitation for the contact plug electrically connecting the gate, such that the opening for forming the contact plug must have a certain width for filling with material such as tungsten to form the contact plug. Accordingly, it is required for the first trench 16 to have a certain width, such as 0.8 micron, for forming the gate to provide a sufficient top surface area for the contact plug to be formed thereon. However, since the second trenches 18 are formed without contact plugs disposed thereon, the trench width can be narrower, for example, 0.2 micron. The first trench 16 and the second trenches 18 are usually formed simultaneously through an etching process. When the trench width is wider, the trench depth becomes deeper. It is because the wider trench is etched in a faster rate due to loading effect. As the depths of all the portions of the p type base 20 are the same, the deeper gate trench will lead to a stronger electric field, such that the electric field as a whole on the substrate is not uniform. Moreover, stronger electric field leads to a reduced breakdown voltage. One conventional solution is to sacrifice the resistance at and near by the p-n junction for increasing the breakdown voltage to a predetermined value. However, the reliability is affected. Another conventional solution is to form a ring-shaped guard ring doped region around the first trench 16. For example, as shown in FIG. 2, the conventional trench power MOSFET 11 further has a guard ring doped region 38. The guard ring doped region 38 is doped with a $p^-$ type dopant with a low concentration, in order to lower the position of the junction to reduce resistance. However, in the conventional process for forming such guard ring doped region, a mask is required to cover the region other than the guard ring doped region, resulting in an increased manufacturing cost, which is described in detail as follows.

In a conventional method of fabricating power semiconductor device, an active area is defined on a semiconductor substrate using a mask, followed by some main steps using masks as shown by the flow chart in FIG. 3. For example, in step 2, forming a guard ring doped region at a predetermined location by doping in the active area in the semiconductor substrate using a mask. In step 3, a gate trench is formed by etching the semiconductor substrate using a mask. In step 4, polysilicon is deposited to fill up the trench and etched back. In step 5, n type and p type doping processes are performed using masks respectively to obtain desired p base, $p^+$ type regions, and source region. After formation of interlayer dielectric, step 6 is performed to form contact plugs by forming through holes in the interlayer dielectric using a mask and filling tungsten metal in the through holes. In step 7, the metal layer on the interlayer dielectric is patterned using a mask to form a source metal layer and a gate metal layer. Generally, in a conventional standard fabrication process, 7 masks are required. Especially, in step 2, a mask is required for forming a guard ring doped region, and it is costly.

Accordingly, it is still needed for a novel method of fabricating power semiconductor device to conveniently and economically resolve or mitigate the problem of non-uniform electric field as aforesaid and maintain high and stable breakdown voltage.

SUMMARY OF THE INVENTION

An object of the present invention is to provide a method of fabricating power semiconductor device, conveniently and economically, being able to improve the uniformity of electric field and maintain high and stable breakdown voltage.

The method of fabricating power semiconductor device according to the present invention comprises steps as follows. First, a substrate having an original top surface and a bottom surface is provided. The substrate is etched through a first mask to form a first trench and at least a second trench, wherein a width of the first trench is greater than a width of the at least a second trench. A gate insulating layer is formed all over the substrate to cover the original top surface and sidewalls and bottoms of the first trench and the at least a second trench. Next, a first deposition process is performed to form a first gate material layer all over the gate insulating layer, wherein the first trench is not fully filled with the first gate material layer. Thereafter, an isotropic or anisotropic etching back process is performed to remove the first gate material layer within the first trench and above the original top surface of the substrate. Thereafter, a tilt ion implantation process is performed all over the substrate to form a first dopant layer in a surface layer of the substrate. The surface layer of the substrate comprises a surface layer of the original top surface of the substrate and a surface layer of the sidewall and the bottom of the first trench. Thereafter, a second deposition process is performed all over the substrate to form a second gate material layer, wherein, the first gate material layer combines the second gate material layer to form a gate material layer, and the gate material layer fills up the first trench and the at least a second trench and covers the gate insulation layer on the original top surface of the substrate. An anisotropic etching back process is performed to partially remove the gate material layer, such that the gate insulation layer on the original top surface of the substrate is exposed. A first ion implantation is performed all over the substrate to form a second dopant layer in a surface of the original top surface of the substrate. A drive-in process is performed to extend the distribution of the dopants of the first dopant layer and the second dopant layer in the substrate, thereby to form a base in the substrate and to form a bottom-lightly-doped layer surrounding a bottom of the first trench and adjacent to the base.

In the present invention, the substrate as the sidewall and the bottom of the wider gate trench is tilt-implanted with dopant at the interval between the back etching the gate material layer and the second time of deposition process, and, during the formation of the base, the tilt-implanted dopant is driven-in at the same time when the dopant for the base is driven-in, to form a bottom-lightly-doped layer surrounding the bottom of the wider gate trench in the substrate. With the formation of the bottom-lightly-doped layer, the problem of non-uniform electric field can be solved or mitigated and the bottom of the gate trench can be protected fully, such that the breakdown voltage can be increased. The bottom-lightly-doped layer is economically and conveniently formed without using additional mask in the manufacturing process.

These and other objectives of the present invention will no doubt become obvious to those of ordinary skill in the art after reading the following detailed description of the preferred embodiment that is illustrated in the various figures and drawings.

DETAILED DESCRIPTION

Figure 1:
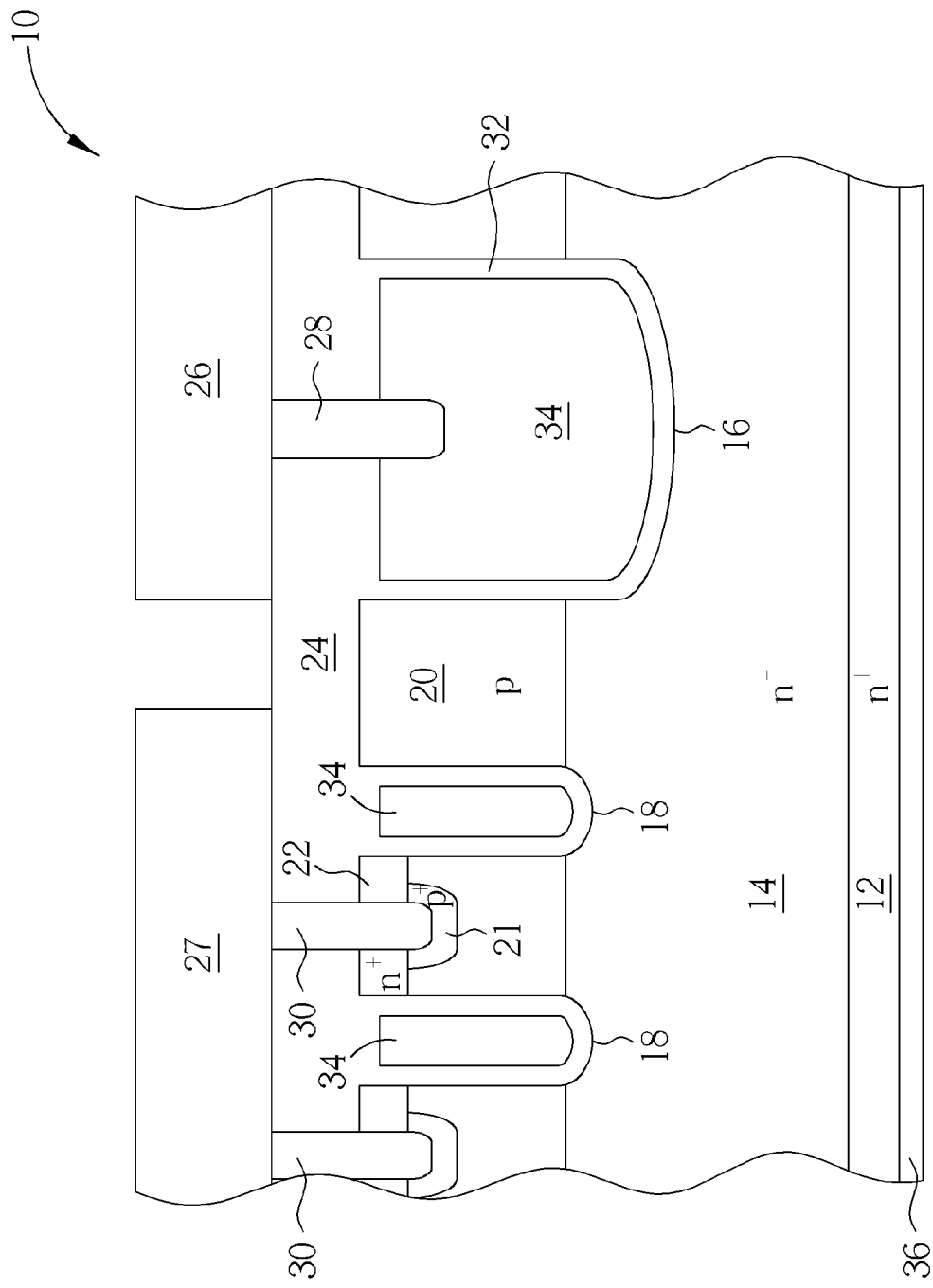
FIG. 1 is a schematic cross-section view illustrating a conventional trench type power MOSFET device.
Figure 2:
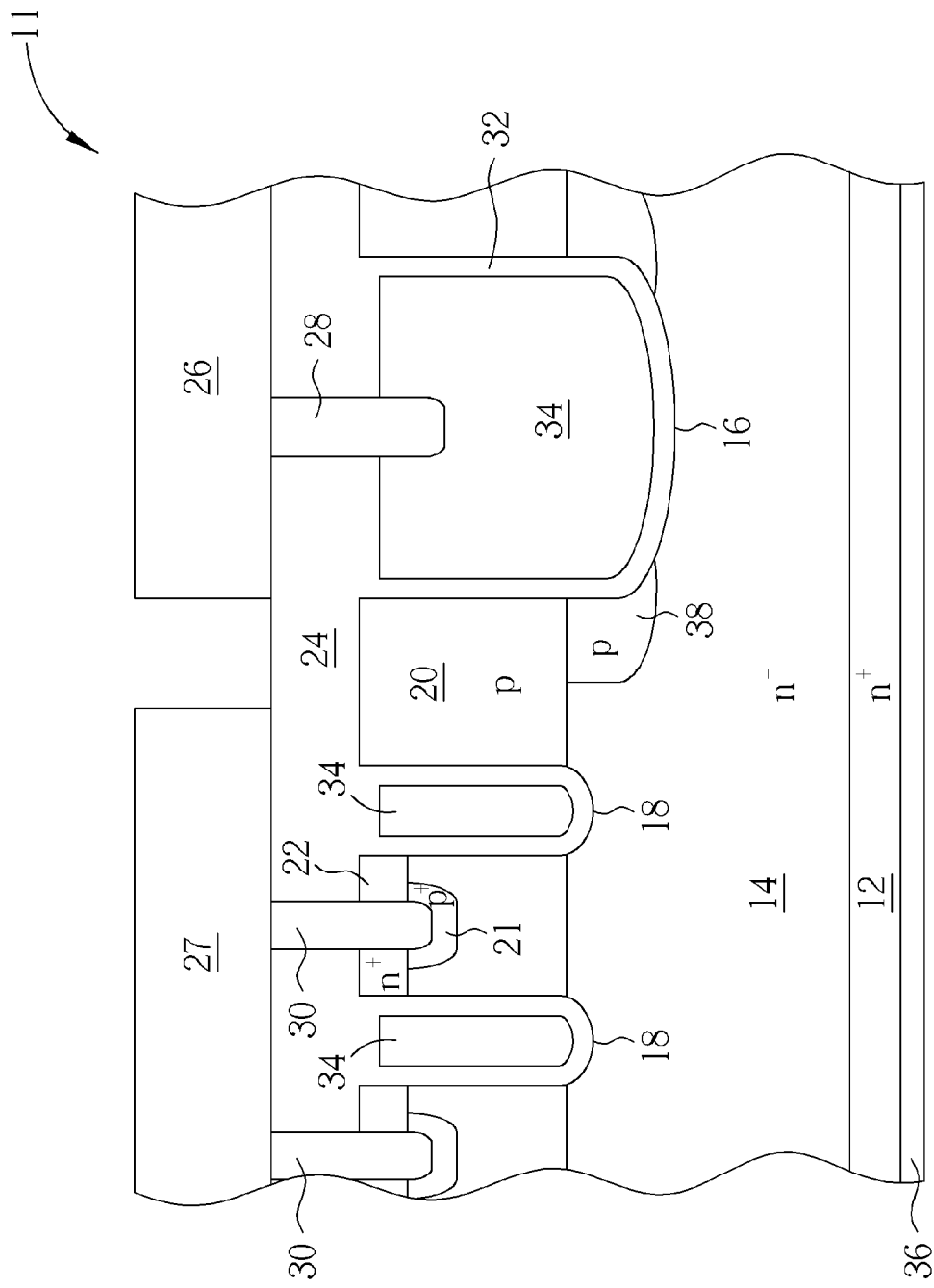
FIG. 2 is a schematic cross-section view illustrating another conventional trench type power MOSFET device.
Figure 3:
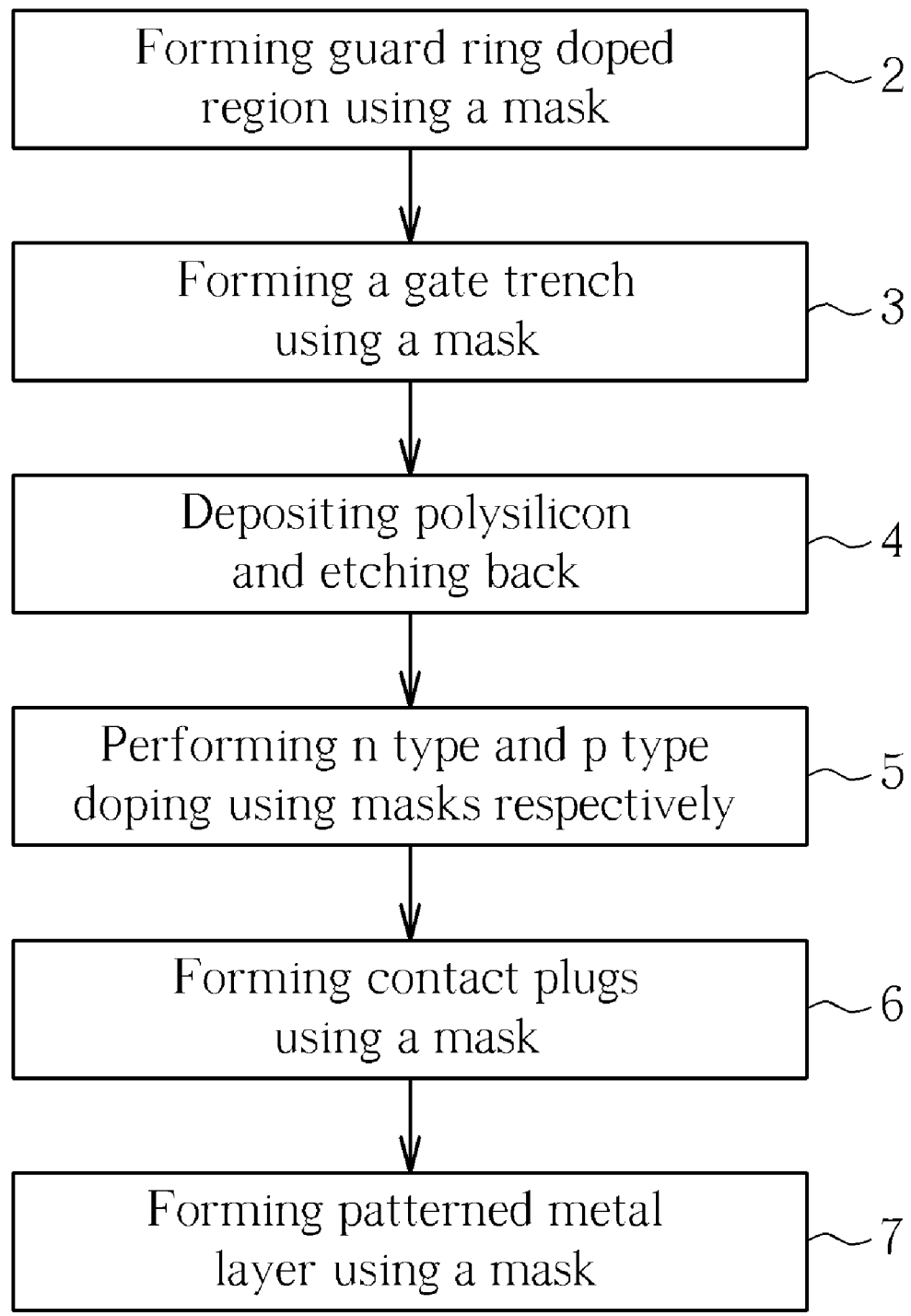
FIG. 3 is a flow chart of main steps utilizing masks in a conventional method of fabricating a power device.
Figure 4:
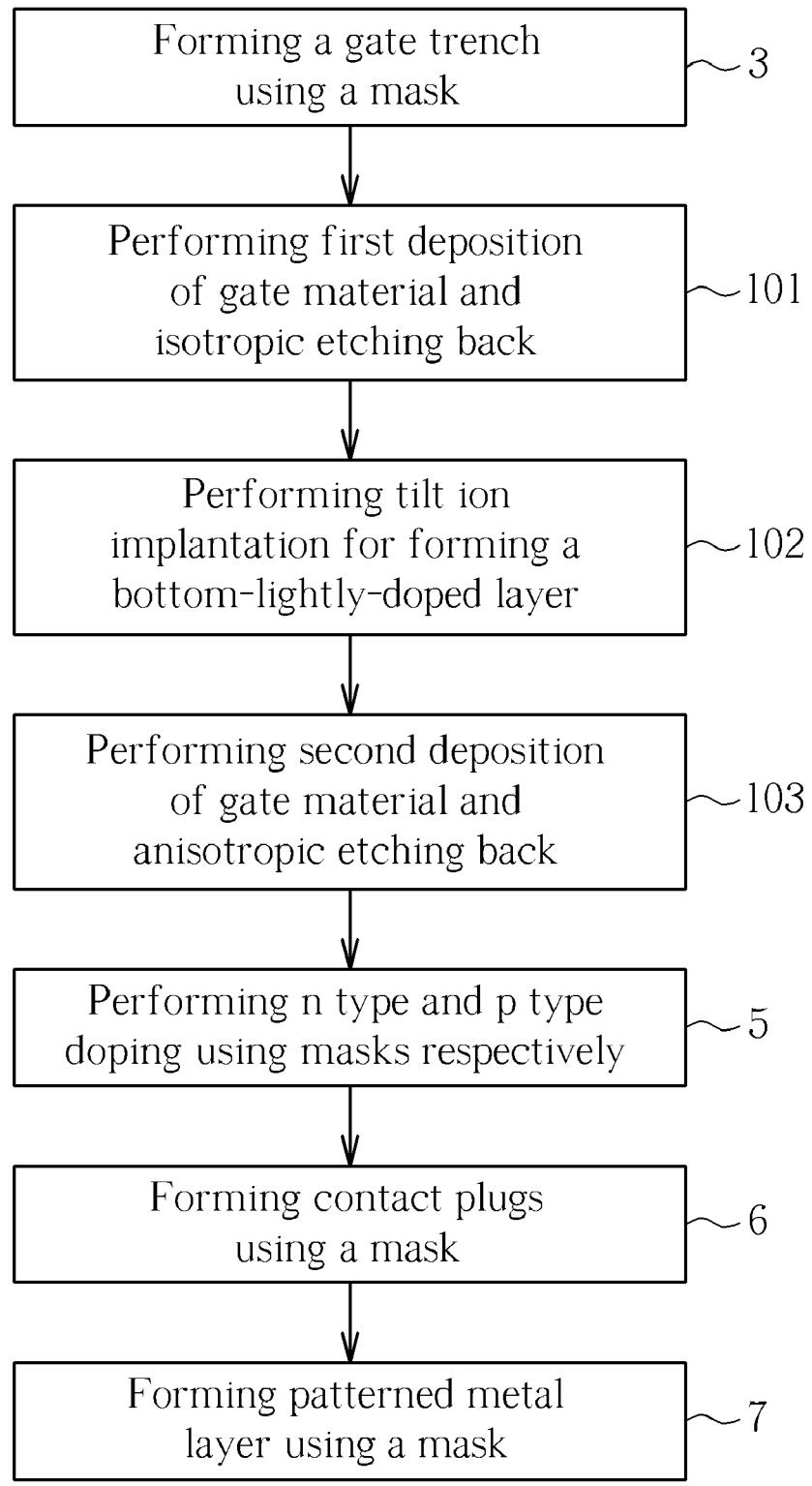
FIG. 4 is a flow chart of main steps utilizing masks in a method of fabricating a power device according to the present invention.

FIG. 4 is a flow chart of main steps utilizing masks in a method of fabricating a power device according to the present invention, which may be compared with the conventional flow chart of main steps as shown in FIG. 3. After the active area is defined, the conventional step 2 for forming the guard ring using a mask is not performed but the step 3 is performed instead to form gate trenches and then to fill the gate trench with the gate material. The filling of the gate material is accomplished by steps 101, 102, and 103. That is, in step 101, the first deposition of gate material and etching back is performed; in step 102, a tilt ion implantation for subsequently forming a bottom-lightly-doped layer is performed; and, in step 103, the second deposition of gate material and etching back are performed. After the filling of the gate trenches, a formation of a base (for example the formation of a p base) may be further performed, in which the dopant of step 102 and the dopant of the base are driven-in simultaneously to form the bottom-lightly-doped layer and the base. Thereafter, steps 5, 6, and 7 are performed. If a passivation layer is further formed using a mask, the total number of mask processes is six, saving one as compared with seven mask processes required by the conventional techniques.

The fabrication method of the present invention may compass, for example, the fabrication method for power devices such as IGBT, MOSFET, BJT, and the like. The power MOSFET may include PMOS type and NMOS type. When a plurality of gate trenches are formed in a power semiconductor device and the trenches have different widths, the wider gate trench obtained may have a deeper depth due to the loading effect during the etching process. The fabrication method of the present invention is suitable for fabricating such power semiconductor devices in which a bottom-lightly doped layer is formed to surround the deeper bottom or the lower portion of the wider gate trench.

An embodiment of the method of fabricating a power NMOSFET device according to the present invention is described as follows and as illustrated by FIGS. 5-12. The formed power device may include trench type power MOSFET device. In the drawings, like numerals designate similar or same parts, regions, or elements. It is to be understood that the drawings are not drawn to scale and are served only for illustration purposes.

Figure 5:
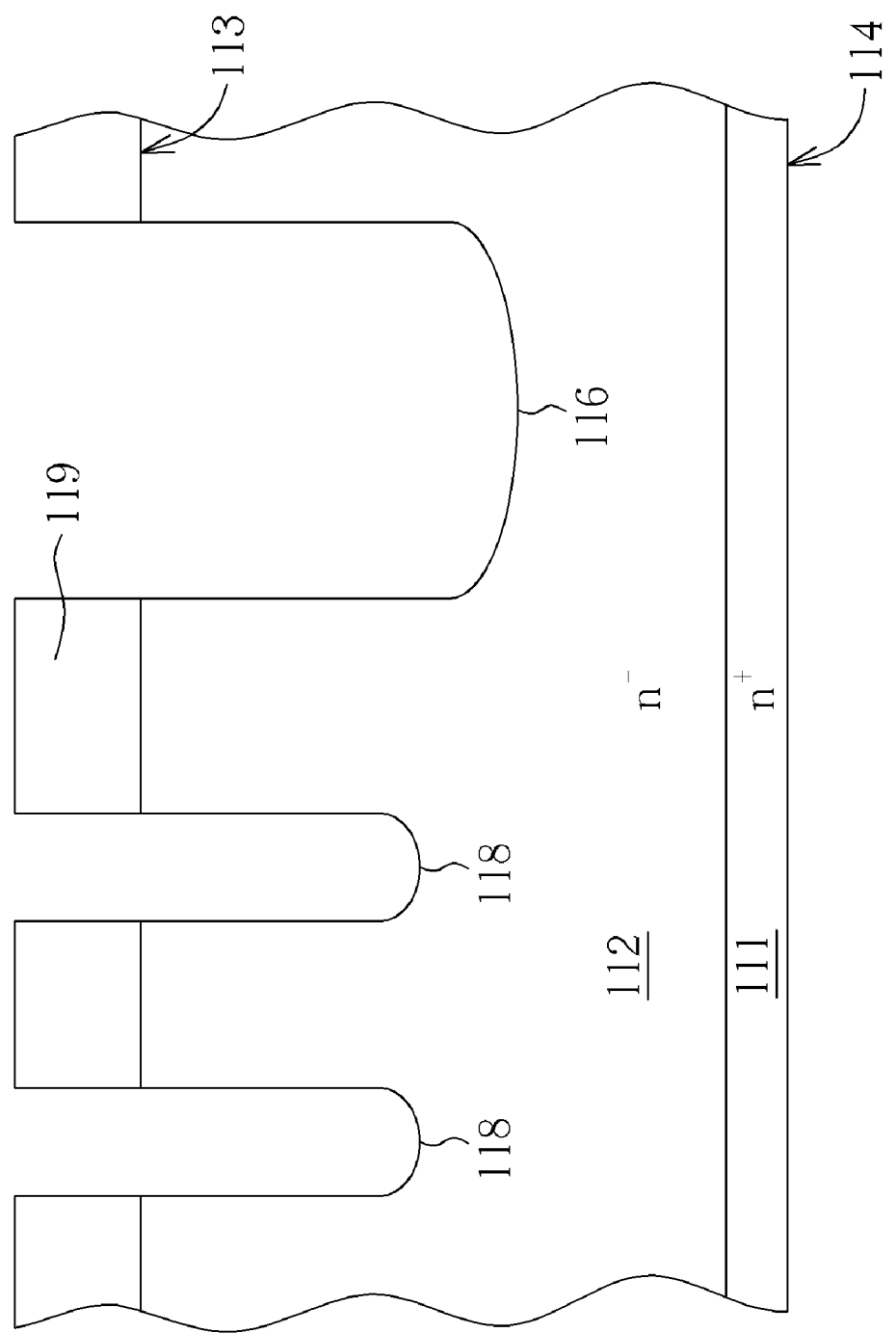
FIGS. 5-12 are schematic diagrams illustrating an embodiment of the method of fabricating a power device according to the present invention.
Figure 6:
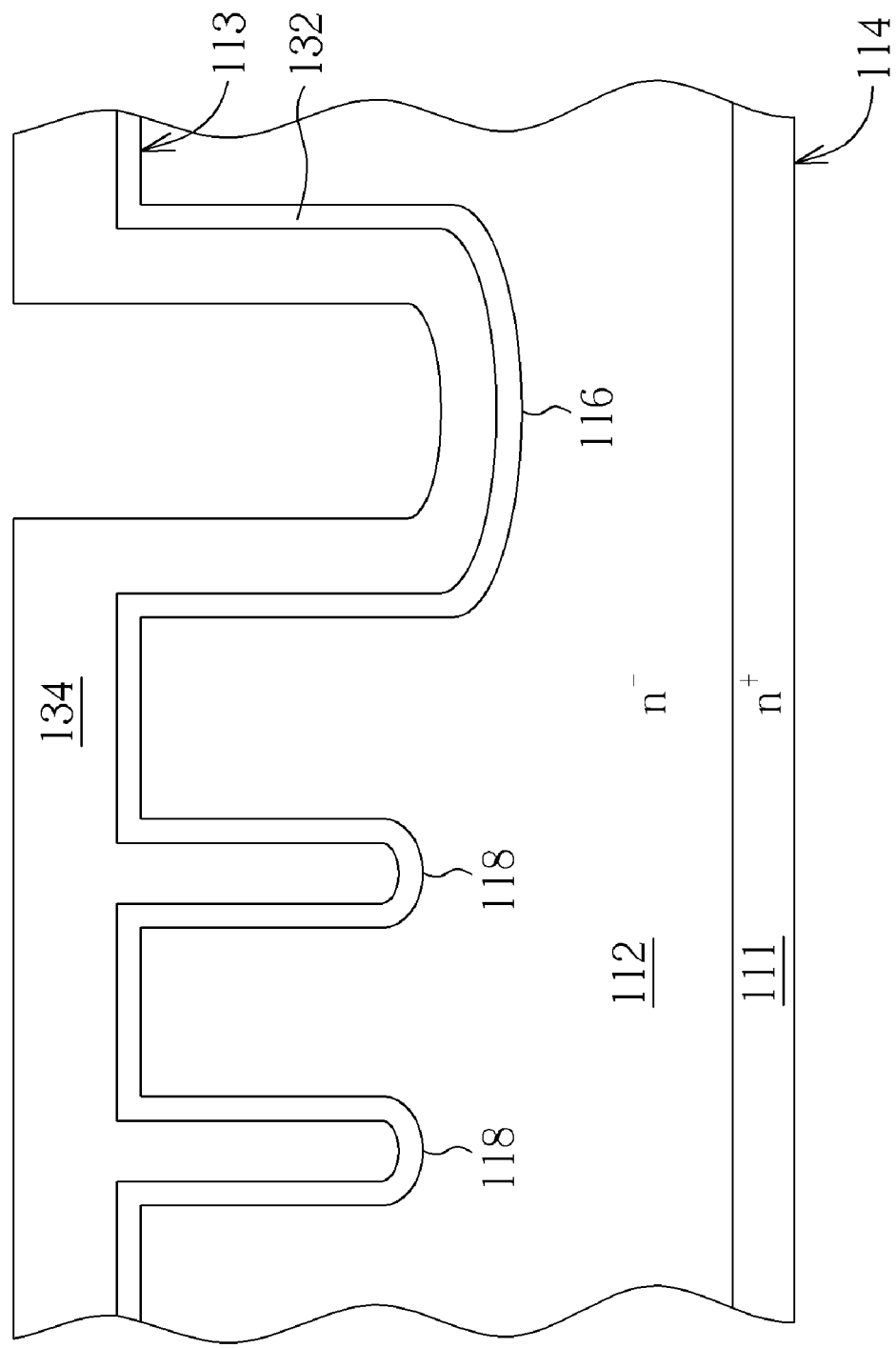

First, as shown in FIG. 5, a substrate is provided. The substrate may be semiconductor substrate, such as silicon substrate. The substrate may comprise a semiconductor wafer substrate 111 and a semiconductor layer 112 formed on the semiconductor wafer substrate 111. When the power device is a high power device, the semiconductor layer 112 may be preferably an n type lightly doped ($n^-$) epitaxial layer. When the power is higher, the thickness of the epitaxial layer should be thicker for enduring higher voltage. The semiconductor wafer substrate 111 may comprise an n type heavily doped ($n^+$) region. The substrate has an original top surface 113 and a bottom surface 114. In this embodiment, the substrate has a semiconductor wafer substrate 111 and a semiconductor layer 112. Thus, the original top surface 113 is the original top surface of the semiconductor layer 112, and the bottom surface 114 is the bottom surface of the semiconductor wafer substrate 111. Thereafter, a patterned photo resist layer 119 is formed on the semiconductor layer 112. The patterned photo resist layer 119 has openings corresponding to positions of gate trenches. A first trench 116 and a plurality of second trenches 118 are formed by etching the semiconductor layer 112 using the photo resist layer 119. The first trench 116 is located in the gate contact plug region. The second trenches 118 are located in the transistor cell region. The first trench 116 is wider and deeper than each of the second trenches 118.

Thereafter, the photo resist layer 119 is removed. Thereafter, referring to FIG. 6, a gate insulating layer 132 is formed all over the semiconductor layer 112 to cover the original top surface 113 and the sidewalls and the bottoms of the first trench 116 and the second trenches 118. The gate insulating layer 132 may include for example silicon oxide and may be made by for example thermal oxidation process. The thickness may be for example 250 to 1000 angstroms. Thereafter, a gate material layer 134 is deposited conformally all over on the gate insulating layer 132 by for example a deposition process. Since the first trench 116 is wider than the second trenches 118, the first trench 116 is not fully filled yet when the second trenches 118 are fully filled with the gate material.

Figure 7:
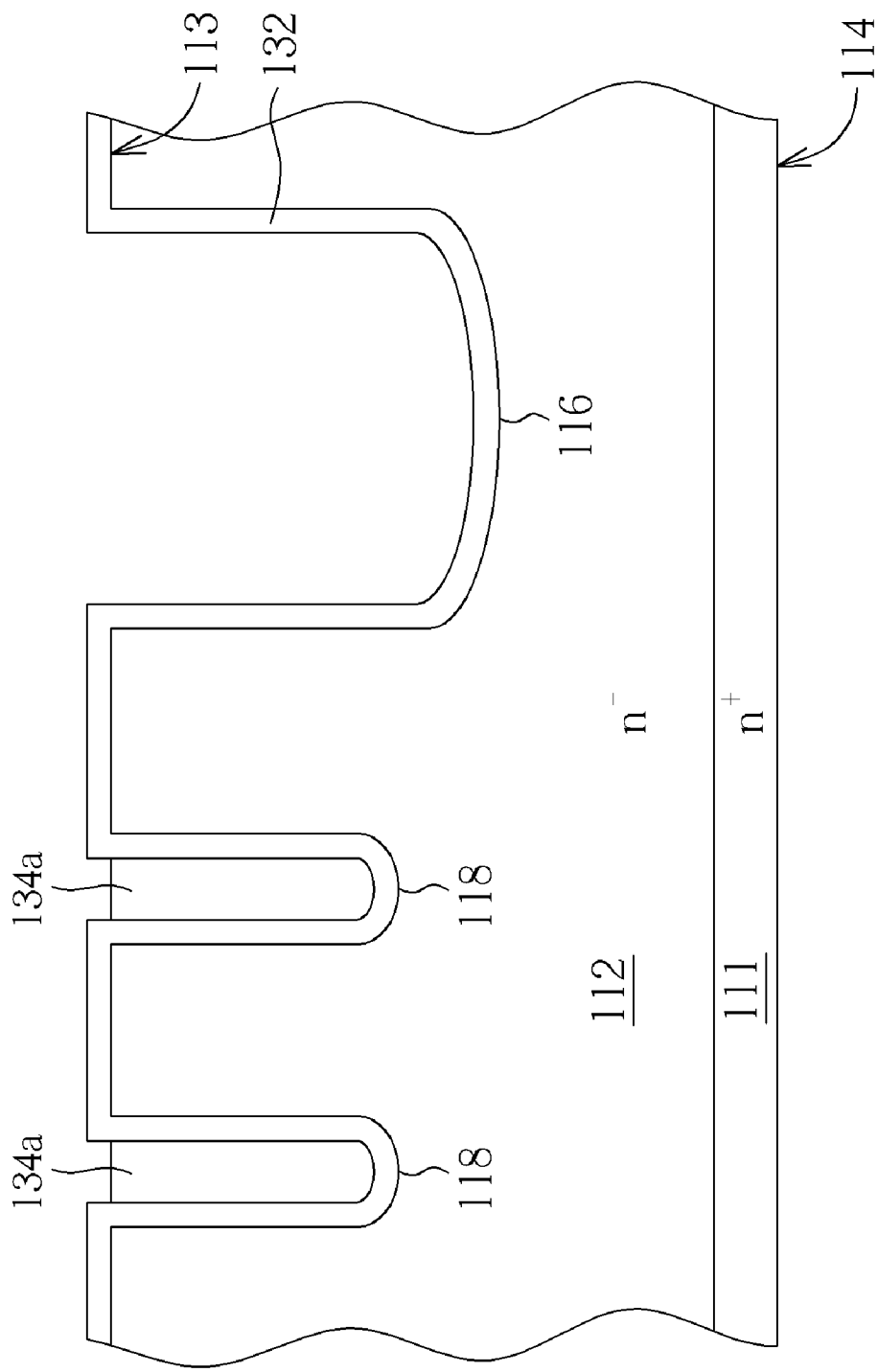

Furthermore, the thickness of the gate material layer on the original top surface 113 is similar to the thickness of the gate material layer on the sidewall and the bottom of the first trench 116. By taking advantage of this timing, an isotropic or anisotropic back etching process may be conveniently performed to remove the gate material layer on the sidewall and the bottom of the first trench 116. Since the gate material layer above the original top surface 113 has a similar thickness to the thickness of the gate material layer on the sidewall and the bottom of the first trench 116, it is also removed simultaneously. The partially-removed gate material layer is as shown in FIG. 7, and this remained gate material layer referred as 134a is within the second trenches 118. The isotropic etching process may be for example wet etching. The etchant should be chosen to have selectivity with respect to the gate material layer over the gate insulation layer. The gate material may be a conductive material, for example, lightly doped polysilicon.

Figure 8:
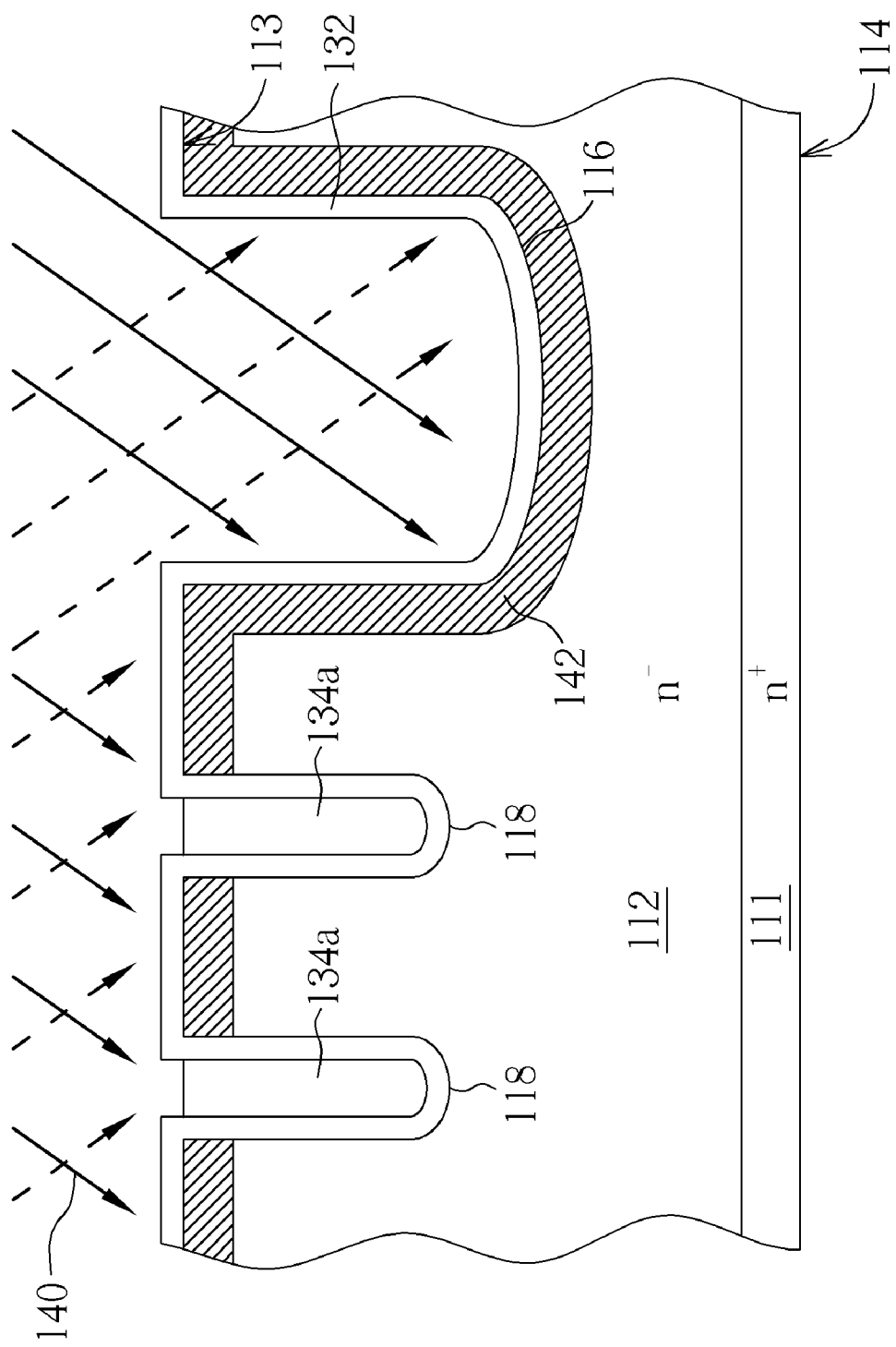

Thereafter, referring to FIG. 8, a tilt ion implantation process 140 is performed all over the substrate to form a first dopant layer 142 in a surface layer of the semiconductor layer 112. The surface layer of the semiconductor layer 112 includes a surface layer of the original top surface 113 of the semiconductor layer 112 and a surface layer of the sidewall and the bottom of the first trench 116. Since the gate material layer within the first trench 116 has been removed previously, when the tilt ion implantation process 140 is performed, the dopant may pass through the gate insulating layer 132 on the trench and be implanted within the surface of the semiconductor layer 112 constituting the sidewall and the bottom of the first trench 116. Besides, since the tilt ion implantation process 140 is performed all over the substrate, the surface of the semiconductor layer 112 at the position of the original top surface 113, on which the gate material layer has also been removed, is also implanted to form the first dopant layer 142. The dopant layer is not formed at the surface of the semiconductor layer 112 at the position of the sidewalls and the bottom of the second trenches 118, because there are still gate material layers 143a within the trenches to form a barrier. The first dopant layer 142 is mainly used for subsequently forming a bottom-lightly-doped layer to share the electric field and protect the bottom of the first trench 116. The tilt angle for forming the first dopant layer 142 may be for example 10 to 45 degrees and the dosage may be for example $1 \times 10^{12}$ to $8 \times 10^{12}$ $cm^{-2}$. The dopant may be for example boron ion or the like. However, it is not limited to these parameters. These process conditions are provided as an embodiment, while not for the limitation of the scope of the present invention. They may be properly selected for use according to structures or manufacturing processes. For example, the tilt angle may be used as long as the dopant(s) can be implanted into the sidewall and the bottom of the gate trench. The species and the dosage of the dopant(s) may be selected according to the desired electrical properties.

Figure 9:
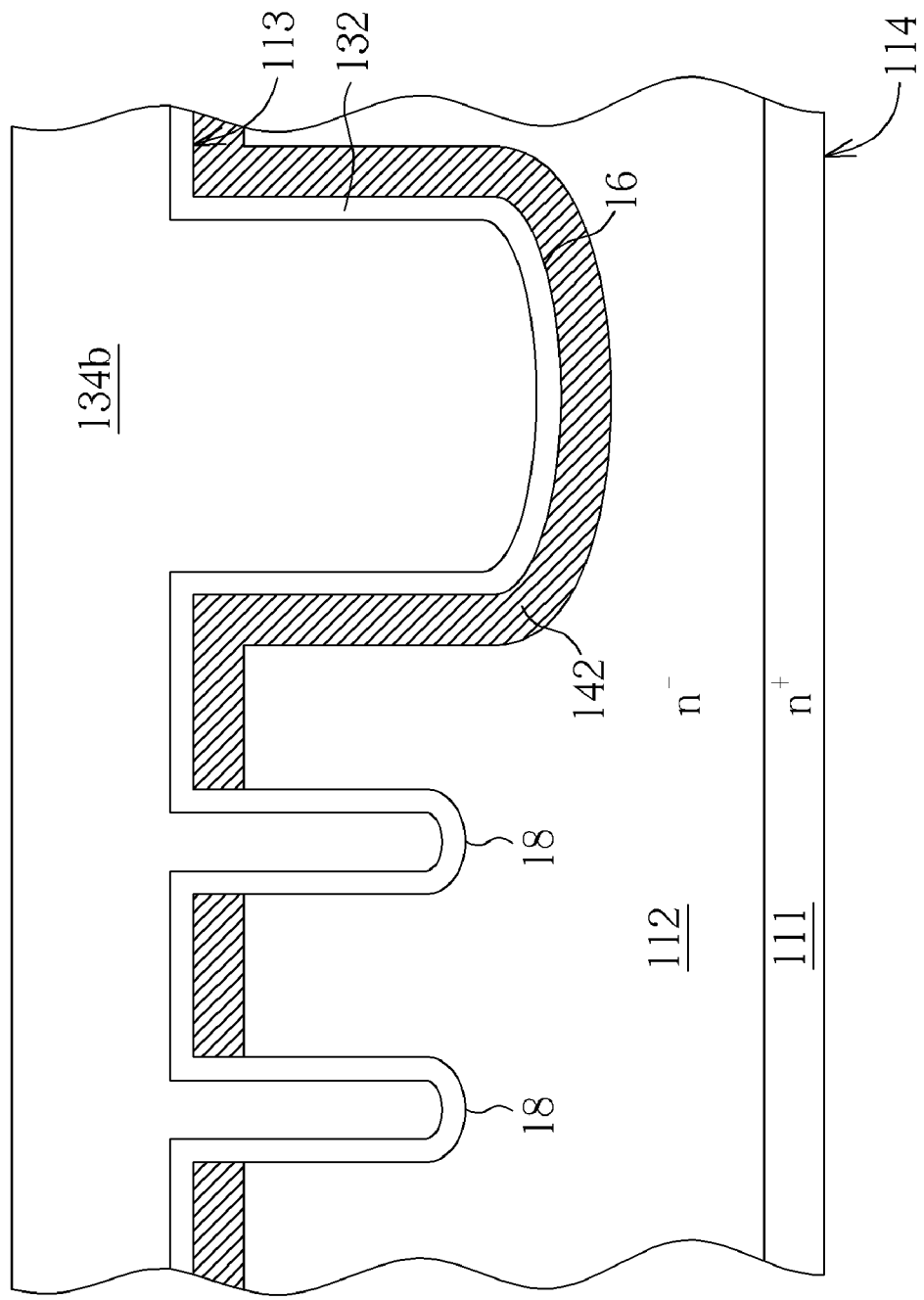

Thereafter, referring to FIG. 9, a deposition process is performed all over the substrate to form a gate material layer again. This gate material layer combines the gate material layer within the second trenches 118 to form a single whole gate material layer referred as 134b. The two original gate material layers are not limited to same or different material. The gate material layer 134b fills up the first trench 116 and the second trenches 118 with a thickness sufficient to cover the gate insulation layer 132 on the original top surface 113.

Figure 10:
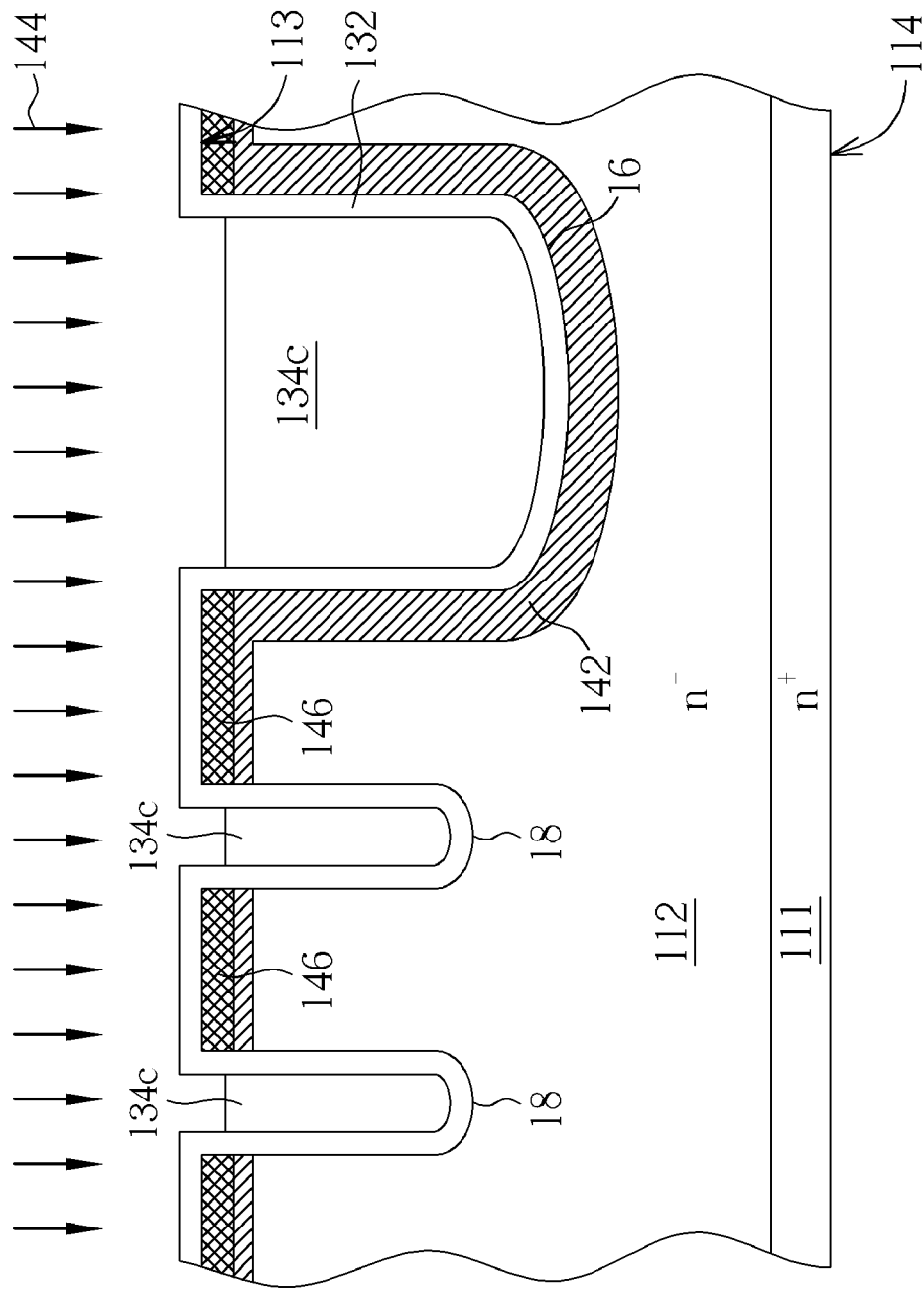

Further referring to FIG. 10, an anisotropic etching back process is performed to partially remove the gate material layer 134b, thereby exposing the gate insulation layer 132 located on the original top surface 113. The anisotropic etching back process may be for example dry etching. Thus, the gate material layer left within the first trench 116 and the second trenches 118 serves as the gate 134c. Thereafter, an ion implantation process 144 is performed all over to form a second dopant layer 146 in the surface of the original top surface 113. Thus, since the trench has been previously fully filled with gate material, the second dopant layer 146 is only formed in the surface of the original top surface 113. The second dopant layer 146 is for subsequently forming a base. The dopant may be the same or different from the dopant of the first dopant layer 142, while with a higher dosage.

Figure 11:
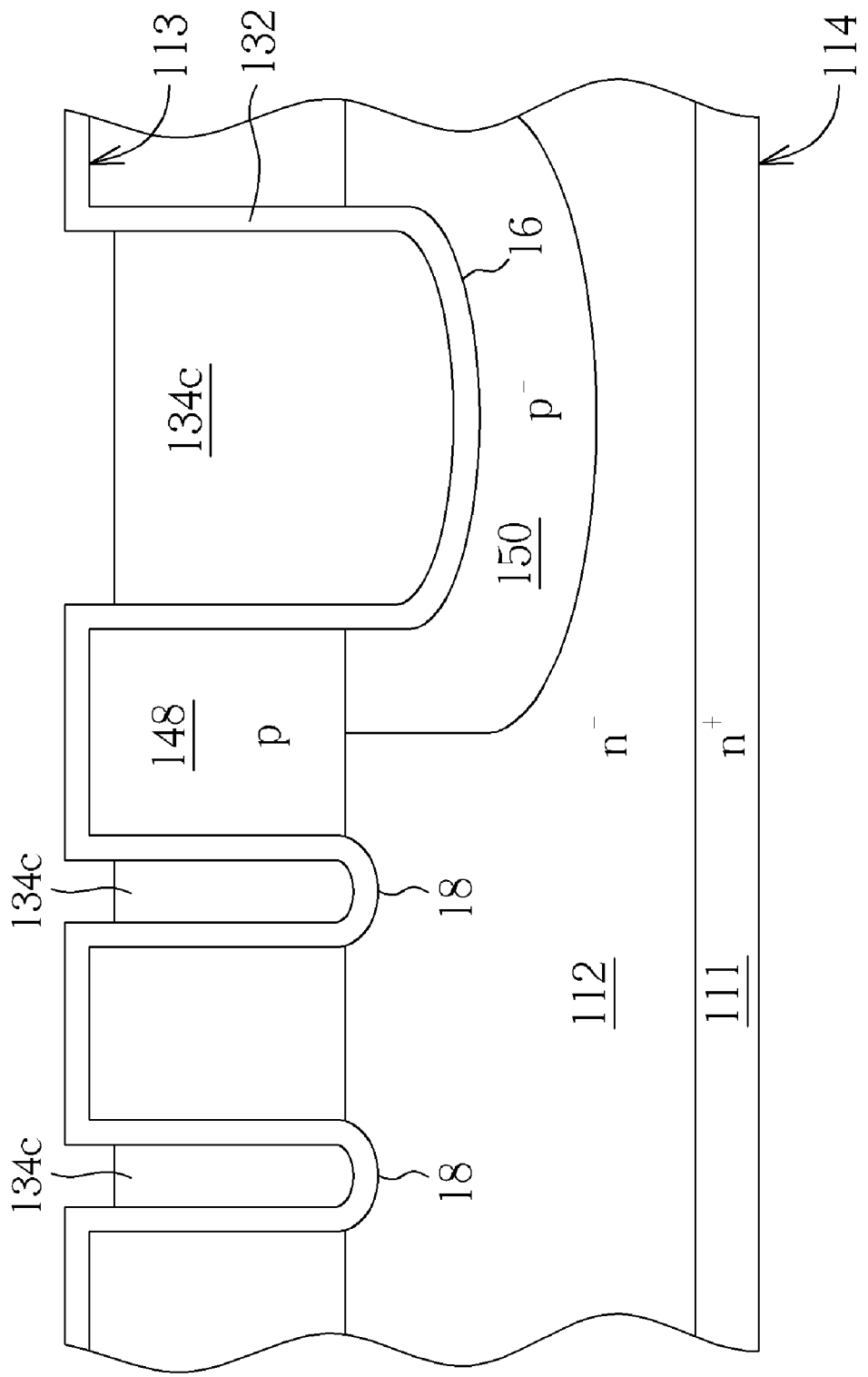

Thereafter, referring to FIG. 11, a drive-in process, such as heating for dopant diffusion, is performed to extend the distribution of the dopants of the first dopant layer 142 and the second dopant layer 146 in the substrate (i.e. the semiconductor layer 112) to a deeper place. For example, the heating may reach to a temperature of 1150° C. for 50 minutes. Thus, the dopant of the second dopant layer 146 on the surface of the original top surface 113 diffuses to the deeper place of the semiconductor layer 112 and forms an enlarged ambit serving as a base 148. In this embodiment, the base 148 is p type doped, and the junction depth may be deep to be for example 1 to 1.5 micron, not lower than the bottom of the second trenches 118. The dopant of the first dopant layer 142 surrounding the first trench 116 diffuses outward to broaden the diffusion extent, forming a bottom-lightly-doped layer 150. In this embodiment, the bottom-lightly-doped layer 150 is $p^-$ type doped, and the junction depth may be deep as for example 0.3 to 0.6 micron. The lower portion of the semiconductor layer 112 is preferably spacious with respect to depletion region. The thickness of the semiconductor layer 112 may be designed according to the demand for voltage endurance. The base 148 overlaps with the bottom-lightly-doped layer 150. Since the dopant concentration of the base 148 is greater than the dopant concentration of the bottom-lightly-doped layer 150, the overlapped region exhibits the properties of the base 148 and becomes a portion of the base 148, as desired by the power MOS device structure. The bottom-lightly-doped layer 150 surrounds the bottom or the lower portion of the first trench 116 and is adjacent to the base 148, accomplishing protection for the bottom of the first trench 116 and sharing the higher electric field caused by the deeper first trench 116. Furthermore, the drive-in processes for the first dopant 142 and the second dopant 146 are performed simultaneously to save thermal budget.

Figure 12:
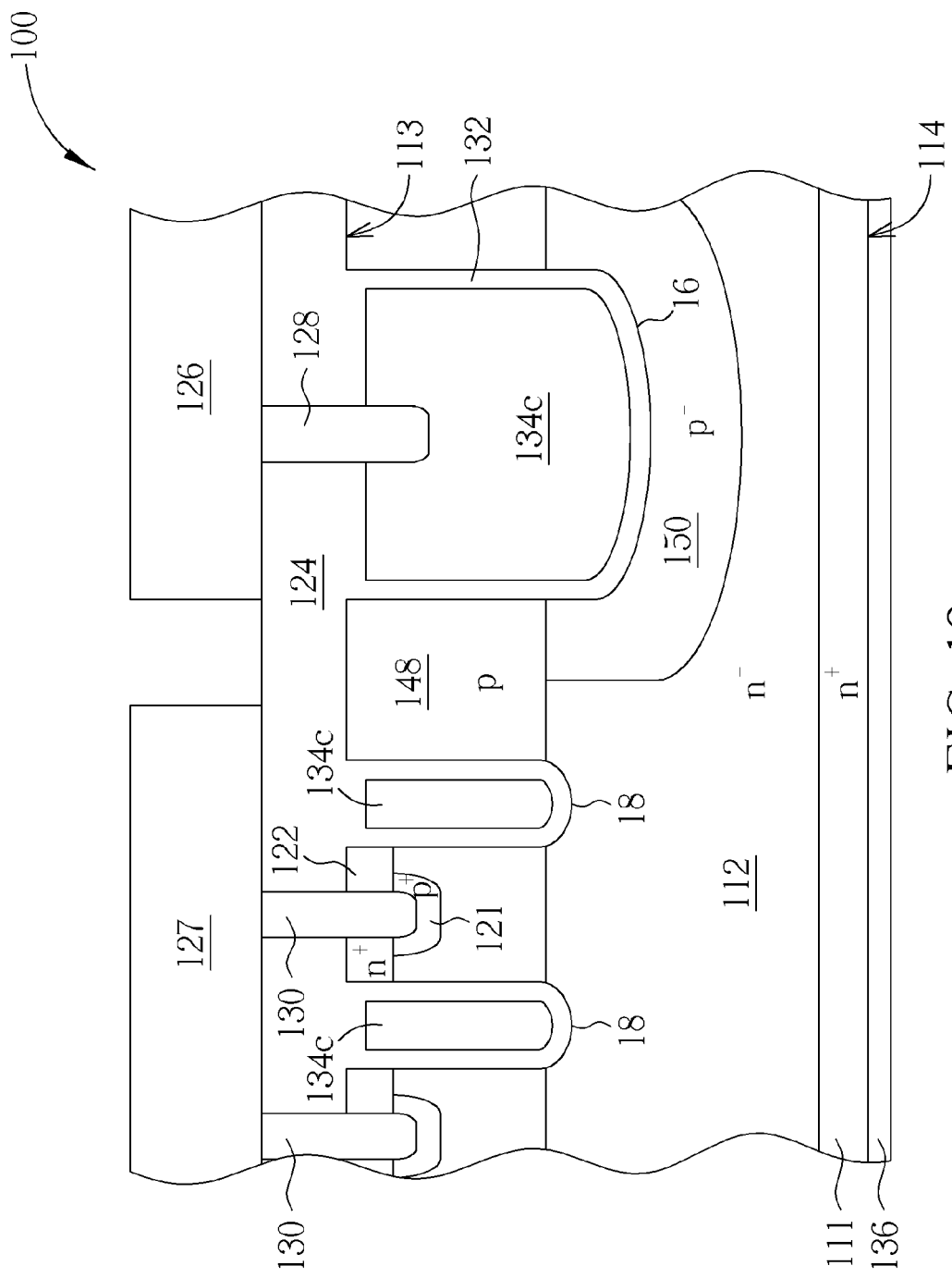

Thereafter, referring to FIG. 12, an ion implantation process is performed through a mask (not shown) to form a plurality of source regions 122 on the base 148. In this embodiment, the source regions 122 is $n^+$ type doped. Before the formation of the source regions 122, an ion implantation may be performed through a mask (not shown) to form a heavily doped $p^+$ type region 121 (i.e. a heavily doped region) on a plurality of contact plug predetermined regions on the base 148. Thereafter, an interlayer dielectric 124 is formed all over the substrate. Thereafter, a through hole is formed throughout the interlayer dielectric 124 and filled with metal, such as tungsten, to form a gate contact plug 128. Through holes are formed throughout the source regions 122 and the interlayer dielectric 124 and filled with metal, such as tungsten, to form a plurality of source contact plugs 130. Moreover, a gate metal layer 126 and a plurality of source metal layers 127 are formed on the interlayer dielectric 124 using a mask. The gate contact plug 128 electrically connects the gate material layer 134c within the first trench 16 and the gate metal layer 126. The source contact plugs 130 electrically connect the heavily doped $p^+$ type regions 121 respectively and the source metal layers 127. A drain metal layer 136 is further formed on the bottom surface 114. The trench type power MOSFET device 100 thus formed is as shown in FIG. 12.

The embodiment described above is an NMOS embodiment. When other types of power devices are fabricated using the method of the present invention, there is no particularly limitation on device size, processing parameters, conditions, electrical properties, except that it is noticed that the thickness of the substrate (for example, the thickness of the semiconductor layer 112 as shown in FIG. 12) should be sufficient for providing sufficient space for forming a depletion region since the bottom-lightly-doped layer surrounds the bottom or the lower portion of the first trench in the present invention.

In the present invention, the problem of non-uniform electric field can be solved or mitigated, the bottom of the gate trench can be protected fully, and the breakdown voltage is increased. Although a bottom-lightly-doped layer is required for the structure, it can be economically and conveniently formed without additional mask used in the manufacturing process. Accordingly, even the fabricating process according to the present invention comprises additional process steps, i.e. poly deposition and etching back, the total number of steps using masks is decreased by one, as compared with the conventional standard process, and this renders it relatively economical and convenient.

Those skilled in the art will readily observe that numerous modifications and alterations of the device and method may be made while retaining the teachings of the invention.

What is claimed is:

1. A method of fabricating power semiconductor device, comprising:
   providing a substrate having an original top surface and a bottom surface;
   etching the substrate through a first mask to form a first trench and at least a second trench, wherein a width of the first trench is greater than a width of the at least a second trench;
   forming a gate insulating layer all over the substrate to cover the original top surface and sidewalls and bottoms of the first trench and the at least a second trench;
   performing a first deposition process to form a first gate material layer all over the gate insulating layer, wherein the first trench is not fully filled with the first gate material layer;
   performing an isotropic or anisotropic etching back process to remove the first gate material layer within the first trench and above the original top surface of the substrate;
   performing a tilt ion implantation process all over the substrate to form a first dopant layer in a surface layer of the substrate, the surface layer of the substrate comprising a surface layer of the original top surface of the substrate and a surface layer of the sidewall and the bottom of the first trench;
   performing a second deposition process all over the substrate to form a second gate material layer, wherein, the first gate material layer combines the second gate material layer to form a gate material layer, and the gate material layer fills up the first trench and the at least a second trench and covers the gate insulation layer on the original top surface of the substrate;
   performing an anisotropic etching back process to partially remove the gate material layer, thereby exposing the gate insulation layer on the original top surface of the substrate;
   performing a first ion implantation all over the substrate to form a second dopant layer in a surface of the original top surface of the substrate; and
   performing a drive-in process to extend the distribution of the dopants of the first dopant layer and the second dopant layer in the substrate, thereby to form a base in the substrate and to form a bottom-lightly-doped layer surrounding a bottom of the first trench and adjacent to the base.

2. The method of claim 1, wherein the first dopant layer comprises a p type dopant.

3. The method of claim 1, wherein the second dopant layer comprises a p type dopant.

4. The method of claim 1, wherein the gate material layer comprises a doped polysilicon.

5. The method of claim 1, wherein the substrate comprises a semiconductor wafer substrate and a semiconductor layer formed on the semiconductor wafer substrate.

6. The method of claim 5, wherein the semiconductor layer comprises an n type lightly doped epitaxial layer.

7. The method of claim 5, wherein the semiconductor wafer substrate comprises an n type heavily doped region.

8. The method of claim 1, wherein the base comprises a p type base.

9. The method of claim 1, wherein the bottom-lightly-doped layer comprises a p type lightly doped layer.

10. The method of claim 1, further performing a second ion implantation through a second mask to form at least a source region on the base.

11. The method of claim 10, wherein the base comprises at least a contact plug predetermined region, and further performing a third ion implantation through a third mask to form a heavily doped region on the at least a contact plug predetermined region.

12. The method of claim 11, further forming an interlayer dielectric all over the substrate, forming at least a source contact plug throughout the at least a source region and the interlayer dielectric, forming a gate contact plug throughout the interlayer dielectric, and forming at least a source metal layer and a gate metal layer on the interlayer dielectric, wherein the at least a source contact plug electrically connects the at least a heavily doped region and the at least a source metal layer, and the gate contact plug electrically connects the gate material layer within the first trench and the gate metal layer.

13. The method of claim 10, further forming a drain metal layer on the bottom surface of the substrate.

* * * * *